(12) United States Patent
Alcoe

(10) Patent No.: US 6,654,250 B1
(45) Date of Patent: Nov. 25, 2003

(54) LOW-STRESS COMPRESSIVE HEATSINK STRUCTURE

(75) Inventor: David James Alcoe, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/254,886

(22) Filed: Sep. 25, 2002

(51) Int. Cl.[7] .................................................. H05K 7/20
(52) U.S. Cl. ........................ 361/719; 257/730; 257/719; 361/749
(58) Field of Search ................................ 165/80.3, 185; 174/16.3, 252, 254; 29/890.03; 267/150, 158, 160; 257/706, 707, 713, 718, 719, 726, 727, 730; 361/704, 705, 707–712, 715, 749, 789, 717–719

(56) References Cited

U.S. PATENT DOCUMENTS

| | | | |
|---|---|---|---|
| 5,280,411 A | 1/1994 | Dirks et al. | 361/707 |
| 5,760,465 A * | 6/1998 | Alcoe et al. | 257/669 |
| 5,812,374 A | 9/1998 | Shuff | 361/704 |
| 6,212,074 B1 | 4/2001 | Gonsalves et al. | 361/717 |
| 6,367,541 B2 * | 4/2002 | McCullough | 165/80.3 |
| 6,373,717 B1 | 4/2002 | Downes, Jr. et al. | 361/795 |
| 6,392,143 B1 * | 5/2002 | Koshio | 174/52.4 |
| 6,411,513 B1 | 6/2002 | Bedard | 361/704 |
| 6,417,027 B1 * | 7/2002 | Akram | 438/109 |

* cited by examiner

*Primary Examiner*—Gerald Tolin
(74) *Attorney, Agent, or Firm*—William N. Hogg

(57) ABSTRACT

A structure and technique for forming an I/C chip module and circuit card construction is provided. An I/C chip module having a flexible substrate, with first and second opposite sides concave, results from the CTE mismatch between the I/C chip and substrate. The I/C chip module is mounted on a flexible circuit card by solderball connection. The curvature of the I/C chip module causes the circuit card to curve correspondingly. A heatsink in thermal contact with the I/C chip places pressure on the I/C chip module in a direction to decrease the curvature. A rigid backing member retains the circuit card, generating a curved space between the backing member and the circuit card. A leaf spring applies pressure to the I/C chip module against the backing member. A compliant member is interposed between the backing member and the circuit board filling a portion of the curved space therebetween.

14 Claims, 3 Drawing Sheets

LOW-STRESS COMPRESSIVE HEATSINK STRUCTURE

BACKGROUND OF THE INVENTION

A very common technique of packaging integrated circuit chips or dies is to mount the integrated circuit chip on or in some type of substrate carrier by various types of mountings, such as control collapse chips (C-4), to form a chip component or chip module, and to mount the chip module or component to a circuit card, such as by a ball grid array (BGA) structure. (The chip and substrate are sometimes referred to as a ball grid array.) One material which has been conventionally used as a substrate for mounting the I/C chip or die is an inorganic ceramic material, such as alumina. These inorganic substrates are relatively rigid and, hence, even when an I/C chip is mounted thereon or therein, any difference in the thermal coefficient of expansion (CTE) between the chip and substrate does not result in any significant warpage of the substrate. Hence, the substrate and the module itself are substantially planar and amenable to attachment by a BGA to circuit board. Such a structure is described in the magazine *IBM Microelectronics* Second Quarter 2000, pages 26–36 (a copy of which is attached hereto and incorporated by reference). In such case, there is not any significant problems vis-à-vis CTE mismatch in making such attachment since the stress has been contained between the die and the substrate mounting the die, and a relatively flat surface is available to mount the component, including the carrier substrate, onto a relatively flat circuit board or card.

However, if one wishes to use more flexible, organic substrates on which or in which to mount the die, as described in the above entitled article, then the differences in the CTEs of the various material can result in a warpage of the component substrate, as described on pages 26 and 27 of the above entitled article. Thus, while certain techniques can be employed to somewhat minimize the warpage of the substrate, nevertheless this warpage cannot be totally eliminated and the techniques to avoid such warpage introduce other design and structural problems into forming the die containing component. Therefore, it is desirable to provide a method and structure to compensate for bowing of the component or I/C chip module due to CTE mismatch and other factors, thus allowing greater freedom of design but without unduly stressing the BGA connections.

SUMMARY OF THE INVENTION

A structure and technique for forming an I/C chip module and circuit card construction is provided. The structure includes an I/C chip module having a flexible substrate with first and second opposite sides. An I/C chip is mounted in, or on the first side of the substrate. The substrate is curved concave with respect to the second side which is the result of CTE mismatch between the I/C chip and substrate. A flexible circuit card is also provided having first and second opposite surfaces. Solderballs are interposed between the second side of the substrate and the first surface of the circuit card in a ball grid array configuration. The solderballs interconnect the substrate to the circuit card. The curvature of the I/C chip module and CTE differences cause the circuit card to curve corresponding to the curve of the module. A heatsink is provided which is in thermal contact with the I/C chip and positioned to place pressure on said I/C chip module in a direction to decrease the curvature. A rigid backing member is also provided to retain the circuit card which, thus, generates a curved space between the backing member and the second surface of the circuit card. A force generating structure, preferably in the form of a spring, such as a leaf spring, is provided to apply pressure to the I/C chip module against the backing member. A compliant member is interposed between the backing member and the second surface of the circuit board filling portions, or all of the curved space therebetween, most critically between the board and backing member in the curved region near the component. By providing the compliant member, when force is applied to the heatsink, the compliant member will flow to conform to the space between the backing member and the second surface of the circuit board, thus evening pressure distribution and preventing the straightening out of the circuit board. Such a straightening out would apply additional stress to the ball grid array structure and could in some cases result in failure of the joints. Rather, the curved structure of the I/C chip module and the corresponding curved structure of the circuit board are maintained to minimize the stress on the solderballs in the ball grid array. In this manner, relatively higher pressure can be utilized without damaging the joined component; it is known that relatively higher pressure contributes to improve thermal contact, better cooling, and thus the invention allows higher power devices to be used with greater reliability and functionality.

DESCRIPTION OF THE PREFERRED EMBODIMENT

According to the present invention, a technique and resulting structure to significantly reduce induced stress from the straightening or flexure of a curved BGA component and circuit card assembly are provided. The invention is particularly useful in reducing such induced stress when the BGA component includes an organic flexible substrate material and the circuit card includes a flexible organic material. The BGA component is typically less than about 4 mm thick on the circuit card, between about ½ to about 5 mm thick. Typically, the combined Young's modulus of the BGA component (i.e. the substrate and circuitry thereon in the region of the chip) is less than about three million psi and the Young's modulus of the circuit board is between about one million and three million psi.

Figure 1:
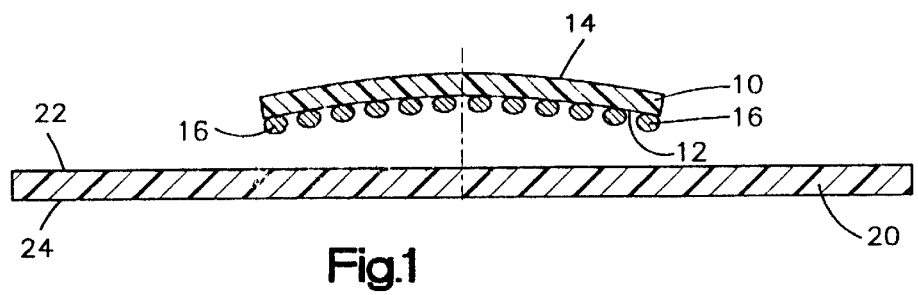
FIG. 1 is a side elevational view, somewhat diagrammatic, showing a non-flat or curved chip module component and a circuit card ready to receive the chip component.

Referring now to the drawings, and for the present to FIG. 1, a ball grid array (BGA) component 10 is shown. The component 10 is depicted as a unitary component in order to illustrate the invention. Typically, the component will have an I/C chip or die either contained within a substrate as shown in the *IBM Microelectronics* article, second quarter 2000, page 36, in FIG. 1 which depicts the high performance, low stress, laminate ball grid array flip chip carrier, and which article is incorporated herein by reference, or it may have an I/C chip or die mounted on the surface of a substrate, as shown in commonly assigned U.S. Pat. No. 6,373,717 B1, which patent also is incorporated herein by reference. For the purpose of this invention, it is not significant what particular structure the ball grid array component 10 has but, rather, that a portion of the BGA component 10 has sufficient flexibility to curve as shown in FIG. 1.

Figure 2:
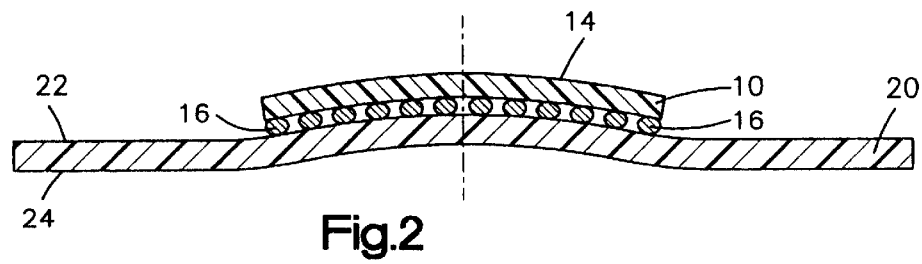
FIG. 2 is a view similar to FIG. 1 showing the component connected to the circuit card by means of a ball grid array or solderballs, causing the circuit card to flex or bend corresponding to the curve of the component.

The BGA component 10 has a first surface 12 and a second surface 14. Solderballs 16 are attached to pads (not shown) on surface 12 and are used to provide connection to circuit card or board 20. The circuit board 20 has a first surface 22 and a second surface 24. The first surface 22 has circuit connection pads (not shown) to which the solderballs 16 are connected, as shown in FIG. 2. The BGA component 10 typically is comprised of an I/C chip or die (not shown) and circuitry (not shown) and an organic substrate, such as FR-4 (a glass filled epoxy), or polyamide or some other organic structure. (As indicated above, if the substrate of the BGA component 10 is formed of a ceramic or relatively rigid material, then the problem of bowing as shown in FIGS. 1 and 2 is not encountered.) However, with the use of the organic flexible material which typically is less than about 4 mm thick, and has a Young's modulus of less than about three million psi and being formed of an organic material, the composite structure of I/C chip, substrate and wiring tends to have the flexibility to bow into a configuration which is concave relative to the surface 12. This bowing can be caused, in part, by CTE differences of the chip to substrate. If the substrate is much larger than the chip, such bowing is typically more prevalent near the chip region. Bowing can also be caused, in part, by CTE differences between the BGA component 10 and the circuit card 20. FIG. 2 depicts such curving of the circuit card 10 corresponding to the curving of the component 20, shown after being attached to the card 20. The circuit board 20 is typically comprised of a flexible organic substrate, such as FR-4 or polyimide, or other dielectric organic material well known in the art, and typically has both surface and internal electrical circuitry (not shown). The composite Young's modulus in such a circuit board is typically one million to three million psi. (As a comparison, it is noted that copper itself has a Young's modulus of about seventeen million psi). The thickness of the circuit board is typically ½ mm to about 5 mm. It is to be understood that there can be various electrical and mechanical connections that are required between the ball grid array component 10 and the circuit board 20, as well as connections between the circuit board 20 and other components. However, these are omitted since they are not germane to the present invention.

Figure 3:
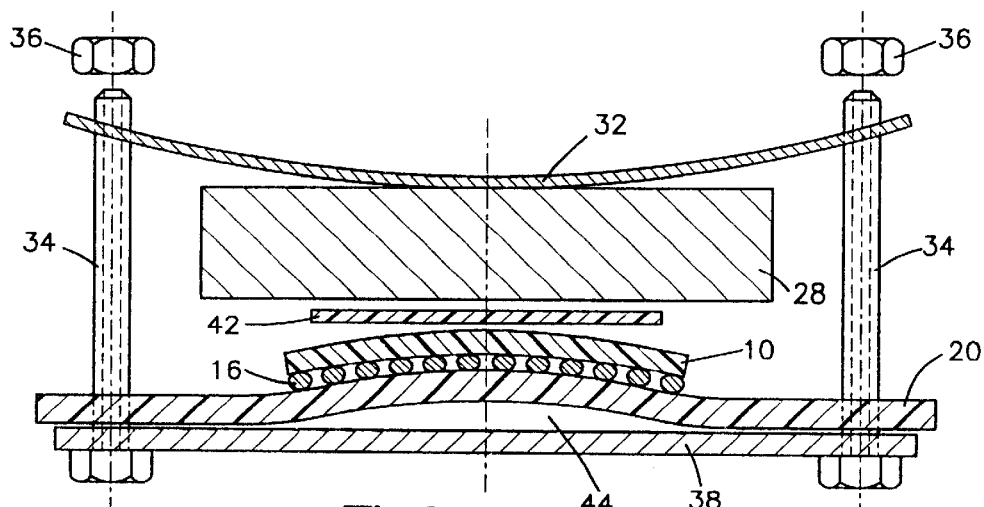
FIG. 3 is a side elevational view of the ball grid array component and circuit card prepared to be assembled with a heatsink to form an assembly for incorporation into an electronic device according to the prior art.
Figure 4:
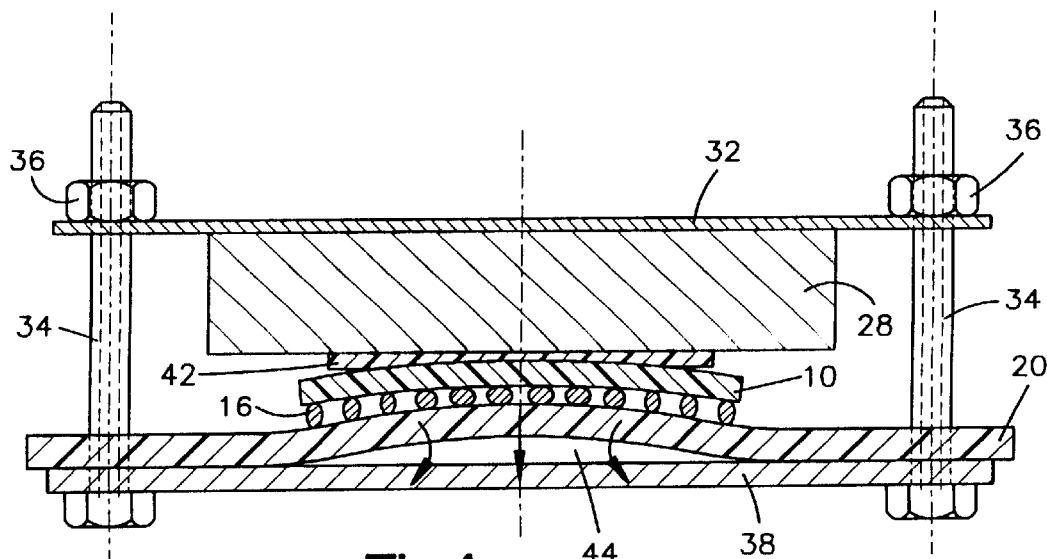
FIG. 4 is a view similar to FIG. 3 showing the application of pressure by a spring on a ball grid array component and circuit card which are of curved configuration against a backing plate according to the prior art.
Figure 5:
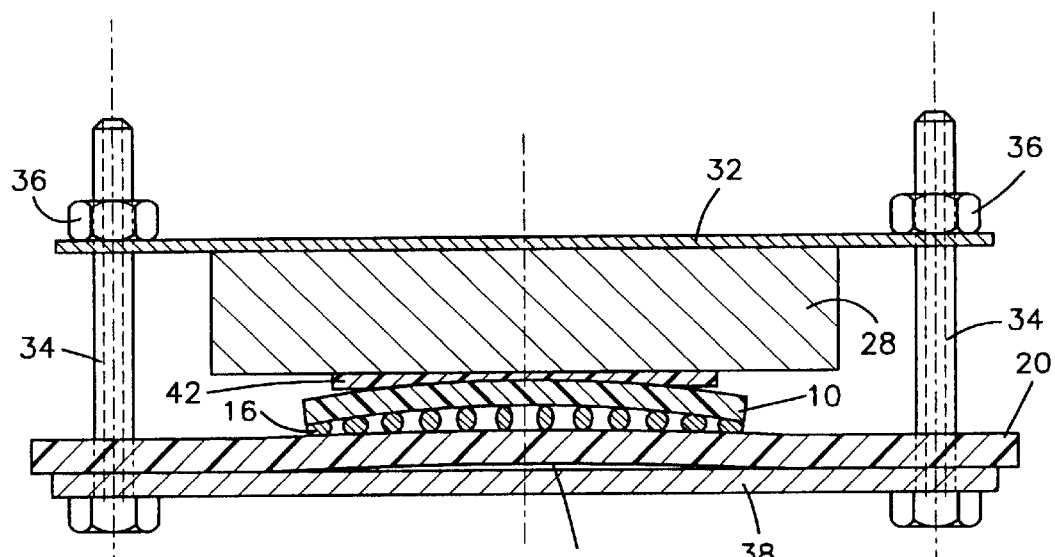
FIG. 5 is a view similar to FIG. 4 showing the structure therein after pressure has been applied and showing somewhat diagrammatically the various configurations taken by the solderballs according to the prior art.

As shown in FIGS. 3, 4 and 5, a typical prior art structure connecting a heatsink to the ball grid array component 10 is shown. A heatsink 28 is provided which typically is a very good thermally conducting material, such as aluminum or copper, and is adapted to be brought into thermal contact with the ball grid array component 10. A clamping structure includes a leaf spring 32 supported on a pair of threaded posts 34 and adapted to be tightened against the heatsink 28 by nuts 36. The posts 34 are mounted on a relatively rigid backer member 38. Thus, in this configuration, there is a concave space 44 between the backer member 38 and the circuit board 20 in the region near the component 10. As shown in FIG. 4, the nuts 36 are screwed down on the threaded posts 34, so as to bias the leaf spring 32 to provide pressure. Preferably, a conformal member 42 is provided between the BGA package 10 and the heatsink 28. This is especially desirable if the die or I/C circuit chip is mounted on top of the substrate as shown in said U.S. Pat. No. 6,373,717 B1. In order to maintain good thermal contact of the heatsink to the BGA component 10, it is preferred that the conformal member 42 be of a material which will flow or conform under pressure and also which will be a good thermal conductor. One particularly good material is T-pli manufactured by Thermagon, Inc. of Cleveland, Ohio. This material is a reinforced boron nitride filled silicone elastomer and, with sufficient pressure, has a thermal conductivity of 6 W/mK which is very good and provides a good thermal path from the BGA component 10 to the heatsink 28.

As can be seen in prior art FIG. 4, as the spring 32 is tightened against the heatsink 28, the conformal material 42 squeezes against the side 14 of the BGA module 10, causing force or pressure to be applied thereto which is transferred unevenly to the solderballs 16 and the circuit board 20, as shown by the arrows in FIG. 4.

Continued application of the pressure will result in the configuration shown in FIG. 5 which tends to flatten out the BGA module 10 and the circuit board 20, but which puts significant additional stress on the solderballs 16, tending to flatten those at the outer edges and elongate those in the center. This additional unwanted stress can lead to early failure.

Figure 6:
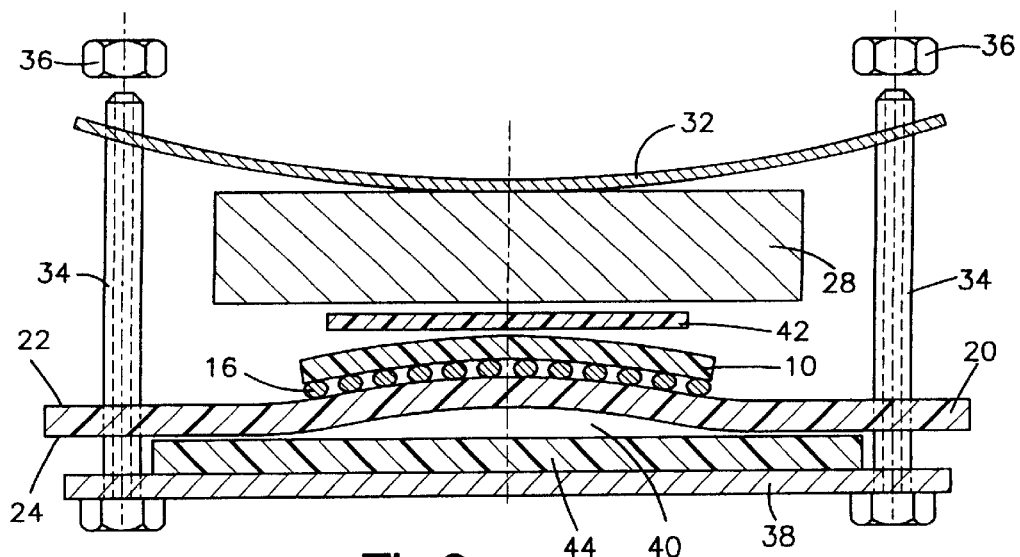
FIG. 6 is a view similar to FIG. 4 but showing the incorporation of a conformal member between the backing plate and the circuit card according to this invention to minimize stress by reducing the flattening effect on the component and the circuit card.
Figure 7:
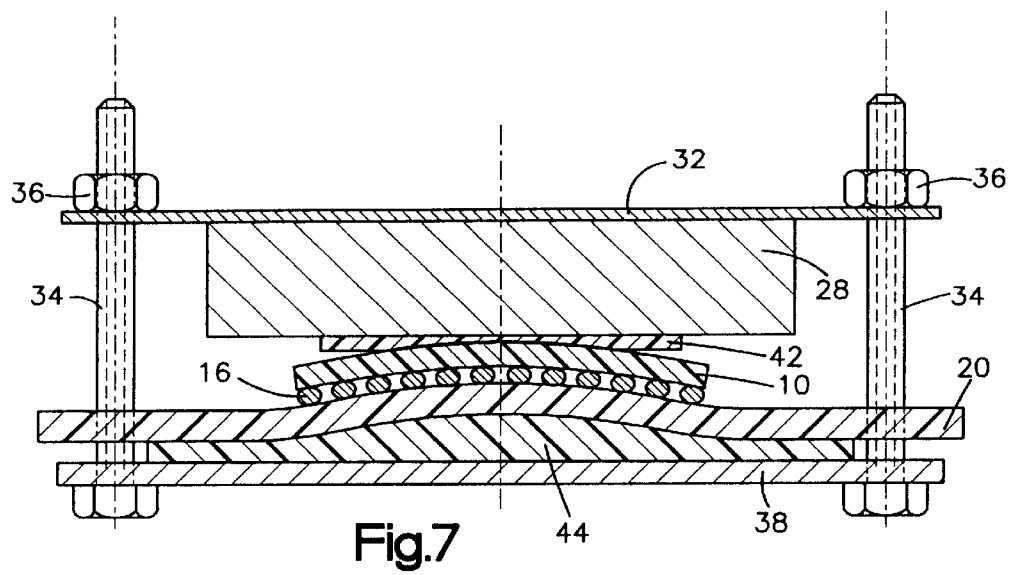
FIG. 7 is a view similar to FIG. 6 with the pressure applied by the spring and showing the conformal member maintaining the curvature and, thus, reducing the stress induced by flattening of the circuit card or component according to this invention.

Referring now to FIGS. 6 and 7, the technique according to this invention prevents or reduces this unwanted additional stress on the solderballs 16, thus minimizing or even eliminating early failure due to additional stress. To perform the present invention, an additional conformal member 44 is provided which is interposed between the circuit board 20 and the rigid backer member 38. As seen in FIG. 6, showing the various parts as assembled, the conformal material 44 is relatively flat. The preferred material for the conformal material is either T-pli (as described above) or PORON. PORON is manufactured by Rogers Corporation of Woodstock, Conn., and is a conformable urethane product having a slightly less thermal conductivity of about 0.1 W/mK. The PORON has the advantage of not having potential for silicone leaching and migration during operation, which could interfere with subsequent soldering operations. Otherwise, the better thermal conductivity with T-pli makes it a slightly preferable material. However, since in many applications the principal thermal path is through the heatsink, and not the backer member, thermal conductivity of the conformal member 44 is not of prime importance.

As the nuts 36 are screwed onto the posts 34, the spring 32 applies pressure to the back of the heatsink 28 just as in the prior art. However, and as can be seen in FIG. 7, the conformal material 44 readily flows into the space 40 between the curved portion of the circuit board 20 and the backer member 38, reducing or in some cases even eliminating the flexure of the ball grid array 10 and the circuit board 20, thus either eliminating or greatly reducing any additional stress. The rigid backer plate retains the circuit card 20 and conformal member 44 in place. Therefore, by providing this conformal member, additional unwanted stress is either eliminated or greatly reduced, thereby contributing to the longer life and less propensity for failure of the ball grid array component and circuit board component when loaded under pressure needed for good thermal performance and associated reliability.

While preferred embodiments of the invention have been described herein, variations in the design may be made, and such variations may be apparent to those skilled in the art of making like structures, as well as to those skilled in other arts. The materials identified above are by no means the only materials suitable for the manufacture of the structure, and substitute materials will be readily apparent to one skilled in the art. The scope of the invention, therefore, is only to be limited by the following claims.

What is claimed is:

1. An I/C chip module and circuit card structure comprising:
   an I/C chip module having a flexible substrate with first and second opposite sides and including an I/C chip, said substrate being curved concave with respect to said second side;
   a flexible circuit card having first and second opposite surfaces,
   solderballs interposed between said second side of said substrate and said first surface of said circuit card connecting said chip module to said circuit card;
   said circuit card being curved to correspond to the curve of the substrate,
   a heatsink in thermal contact with said I/C chip and positioned to place pressure on said I/C chip module in a direction to decrease the curvature thereof;
   a rigid backing member to retain the circuit card,
   a force generating structure to apply pressure to said I/C chip module against said backing member,
   a conformal member interposed between said backing member and the second surface of the circuit card filling at least a portion of the curved space therebetween.

2. The invention as defined in claim 1 wherein said thermal contact of said heatsink to said I/C chip is through a thermally conductive conformal member between said heatsink and said I/C chip module.

3. The invention as defined in claim 1 wherein said force generating structure includes a spring.

4. The invention as defined in claim 3 wherein said spring is a leaf spring support between upright posts extending from said backing member.

5. The invention as defined in claim 1 wherein the Young's modulus of said flexible substrate is less than about three million psi.

6. The invention as defined in claim 1 wherein the Young's modulus of the circuit board is between one million and three million psi.

7. The invention as defined in claim 1 wherein the Young's modulus of said flexible substrate of said modulus is less than about three million psi, and the Young's modulus of the circuit board is between one million and three million psi.

8. The invention as defined in claim 1 wherein said conformal member located between said backing member and the second surface of said circuit board includes polyurethane.

9. The invention as defined in claim 7 wherein said conformal member located between said backing member and the second surface of said circuit board includes silicone.

10. The invention as defined in claim 9 wherein said silicone is a boron filled silicone.

11. The invention as defined in claim 7 wherein the thickness of the substrate of the module is less than about four millimeters.

12. The invention as defined in claim 7 wherein the thickness of the circuit board is from about one-half to about five millimeters.

13. The invention as defined in claim 7 wherein the substrate of the modulus is less than about four millimeters, and the thickness of the circuit board is from about one-half million to about five millimeters.

14. The invention as defined in claim 1 wherein the substrate of said modulus includes an organic dielectric material.

\* \* \* \* \*